United States Patent [19]
Taniguchi et al.

[11] Patent Number: 5,818,765
[45] Date of Patent: Oct. 6, 1998

[54] SEMICONDUCTOR MEMORY DEVICE HAVING AUXILIARY MEMORY

[75] Inventors: Kazuo Taniguchi; Masayuki Miyabayashi, both of Kanagawa; Yuji Yamaguchi, Tokyo, all of Japan

[73] Assignee: Sony Corporation, Japan

[21] Appl. No.: 912,373

[22] Filed: Aug. 18, 1997

[30] Foreign Application Priority Data

Aug. 20, 1996 [JP] Japan .................................. 8-218842

[51] Int. Cl.[6] ................. G11C 7/00; G11C 8/00
[52] U.S. Cl. ................ 365/189.05; 365/230.03; 365/230.08
[58] Field of Search ............ 365/189.05, 230.03, 365/230.08

[56] References Cited

U.S. PATENT DOCUMENTS 5,719,890  2/1998  Thomman et al. ............... 365/189.05

Primary Examiner—David C. Nelms
Assistant Examiner—Trong Phan
Attorney, Agent, or Firm—Ronald P. Kananen

[57] ABSTRACT

A semiconductor memory comprising a memory cell array including a plurality of the memory cells arranged in a matrix, the memory cells being able to be written with and read out data; a reading/writing means for reading and writing data with respect to a selected memory cell; a plurality of auxiliary data storing means arranged in series, a first means among them being connected to the memory cell array and each of the auxiliary data storing means storing a part of the data stored in the memory cell array; a plurality of data output means, each of the data output means being connected to one of the auxiliary data storing means; and a plurality of external data buses, each of the external data buses being connected to one of the data output means; each of the data output means being able to independently output the data stored in a corresponding auxiliary data storing means to a corresponding external data bus.

10 Claims, 7 Drawing Sheets

SEMICONDUCTOR MEMORY DEVICE HAVING AUXILIARY MEMORY

BACKGROUND OF THE INVENTION

1. Field of the Invention

The present invention relates to a semiconductor memory device, more particularly a semiconductor memory device having a main memory constituted by dynamic random access memory (DRAM) able to output the stored data to an external unit at a high speed.

2. Description of the Related Art

To improve the efficiency of access to a memory device, it may be considered to add an auxiliary memory device constituted by registers etc. to the DRAM of the main memory device, transfer the data stored in the main memory device to the auxiliary memory device once, then output it to an external unit from the auxiliary memory device.

This kind of semiconductor memory device is mainly used for storing image data in computer graphics (CG). In recent years, two-dimensional computer graphics have evolved rapidly into three-dimensional computer graphics not only in computer aided design (CAD) but also in production of images and video games. The ability to producing images with greater reality is now demanded. One means to improve the ability of expression of graphics is texture mapping—which paints pictures or patterns on objects. Whatever the case, computer graphic systems with higher performance and lower coat are being demanded.

To achieve this, in three dimensional computer graphic systems, use is being made of high speed and high performance memory devices equipped with auxiliary memory devices for enabling the flexible and efficient use of drawing data, Z-coordinate data for hidden surface processing, and texture data and for realizing high speed performance by parallel processing.

FIG. 1 is a block diagram showing one example of a memory device of the related art for achieving the above. In FIG. 1, reference number 101 denotes a reading/writing buffer (RWBUF), 102 denotes a main memory, for example a memory cell array constituted by a DRAM, 103 denotes an auxiliary memory (AUXHEM) and 104 denotes a reading buffer (RBUF), respectively. The reading/writing buffer 101 transmits the input data from external circuits to the memory cell array 102 or outputs data stored in the memory cell array 102 to the external circuits. The memory cell array 102 stores the data transmitted from the reading/writing buffer 101 and outputs the stored data to the external circuits through the reading/writing buffer 101, or transmits the data to the auxiliary memory 103 through sensing amplifiers and transfer gates, not shown in FIG. 1. Reference numeral S10 in FIG. 1 is a control signal used to control the transfer of part of the data stored in memory cell array 102, for example, a line's worth of data stored in the memory cell array 102, to the auxiliary memory 103. The auxiliary memory 103 stores the data transferred from the memory cell array 102 through the sensing amplifiers once and outputs the stored data to the external circuit through the reading buffer 104 in response to a reading request from the external circuit. In this example, the auxiliary memory 103 has a capacity equal to one line of the memory cell array 102 and is constituted by, for example, registers or cache memories. The reading buffer 104 outputs the data stored in the auxiliary memory 103 to the external circuits in response to reading requests from the outside.

In the memory device shown in FIG. 1, the reading and writing of data is generally performed through the reading/writing buffer 101. A part of the data, for example, a line's worth of the data, selected by a row decoder is transmitted from the memory cell array 102 in the auxiliary memory 103 and output to the external side through the reading buffer 104.

FIG. 2 is a circuit diagram of an example of the configuration of a part of the memory cell array 102 and the auxiliary memory 103. In FIG. 2, reference number 102a denotes a part of the memory cell array 102 shown in FIG. 1, for example, here, a memory cell array with folded bit lines formed by 16 memory cells connected to 4 word lines W0, W1, W2, and W3 and 8 bit lines B00, B01, B10, B11, B20, B21, B30, and B31, and arranged to form a matrix, 101 denotes a reading/writing buffer (RWBUF), 103 denotes an auxiliary memory (AUXMEM), 104 denotes a reading buffer (RBUF), 105 denotes a sensing amplifier circuit (S/A) and 106 denotes a transfer gate (TG), respectively. S20 and S21 denote driving signal lines of the sensing amplifier circuit 105, M20 and M21 denote driving signal lines of the auxiliary memory 103, DD0 and DD1 denote input/output data lines of the reading/writing buffer 101, C20 denotes a control signal line of the transfer gate 106, DA0 and DA1 denote output data lines of the auxiliary memory 103, AD0, AD1, AD2, and AD3 denote data input/output control signal lines of the memory cell array 102a, and AA0, AA1, AA2, and AA3 denote data output control signal lines of the auxiliary memory 103, respectively.

Next, an explanation will be made of the operations of data input/output, the transfer of data to the auxiliary memory 103, and the output of the data of the auxiliary memory 103 with reference to FIG. 2. In this example, the data stored in the memory cell array 102, for example, a lines worth of data, is selected by hold the word line designated by row address at a high level. By operating the sensing amplifier circuit 105 while the transfer gate 106 is closed, the selected data will be latched in the sensing amplifier circuit 105. Then, the transfer gate 106 is opened and the one line's worth of data latched in the sensing amplifier circuit 105 is transferred to the auxiliary memory 103. After that, by closing again the transfer gate 106, the transfer of one line's worth of data from the memory cell array 102a to the auxiliary memory 103 is finished. After the data transfer, the memory cell array 102a and the auxiliary memory 103 can operate independently. For example, in three-dimensional image data, by transferring the texture data to the auxiliary memory 103 and independently accessing it from the drawing data or the processing of the Z-coordinate data, the memory can be used with a high speed and high efficiency.

In the memory device described above, however, only one auxiliary memory 103 is provided, so can store only one line's worth of data of the memory cell array 102a, so the improvement of the data transfer rate is limited. Furthermore, when desiring to provide a plurality of auxiliary memories to realize high speed data transfer, it is difficult to provide the same number of auxiliary memory cells as the sensing amplifiers due to limitations of the layout. Conventionally, column selectors etc. are arranged first, then registers are arranged in correspondence to the plurality of the sensing amplifiers. The increase of the number of data transfers and the reduction of the number of bits transferred results in a deterioration in the efficiency of memory access.

SUMMARY OF THE INVENTION

As object of the present invention is to provide a semiconductor memory device having auxiliary memories achieving a high memory access efficiency by arranging plurality of auxiliary memories and minimizing the increase of dimensions of the memory chip.

According to a first aspect of the present invention, there is provided a semiconductor memory device comprising a memory cell array including a plurality of memory cells being able to be written with and read out data arranged in a matrix; a reading/writing means for reading and writing data with respect to a selected memory cell; a plurality of auxiliary data storing means arranged in series, a first means of said plurality of auxiliary data storing means being connected to the memory cell array, and each of the auxiliary data storing means storing a part of the data stored in the memory cell array; a plurality of data output means, each of the data output means being connected to one of the auxiliary data storing means; and a plurality of external data buses, each of the external data buses being connected to one of the data output means; wherein each of the data output means is able to independently output the data stored in a corresponding auxiliary data storing means to a corresponding external data bus.

According to a second aspect of the present invention, there is provided a semiconductor memory device comprising a memory cell array including a plurality of memory cells being able to be written with and read out data arranged in a matrix of a plurality of word lines and a plurality of bit lines; a reading/writing means for reading and writing the data of a selected memory cell addressed by a selected word line and a selected bit line; a plurality of auxiliary data latches arranged in series, a first auxiliary data latch of said plurality of auxiliary data latches being connected to the memory cell array, and each of the auxiliary data latches storing data of a selected word line sector of the memory cell array; a plurality of data output means, each of the data output means being connected to a corresponding auxiliary data latch; and a plurality of external data buses, each of the external data buses being connected to a corresponding data output means; wherein each of the data output means is able to output the data stored in a corresponding auxiliary data latch to a corresponding external data bus independently.

In accordance with the present invention, data stored in the main memory is transmitted to the auxiliary memories through, for example, the transferring means and stored by the auxiliary memories once. Further more, the data stored in the auxiliary memories is output to an external unit through, for example, the data output buffers. In this way, the data transfer rate and data access efficiency can be increased and the performance of the semiconductor memory device can be improved while suppressing any increase of dimensions of the memory chip.

BRIEF DESCRIPTION OF THE DRAWINGS

These and other objects and features of the present invention will become clearer from the following description of the preferred embodiments made with reference to the attached drawings, in which.

DESCRIPTION OF THE PREFERRED EMBODIMENTS

First Embodiment

Figure 1:
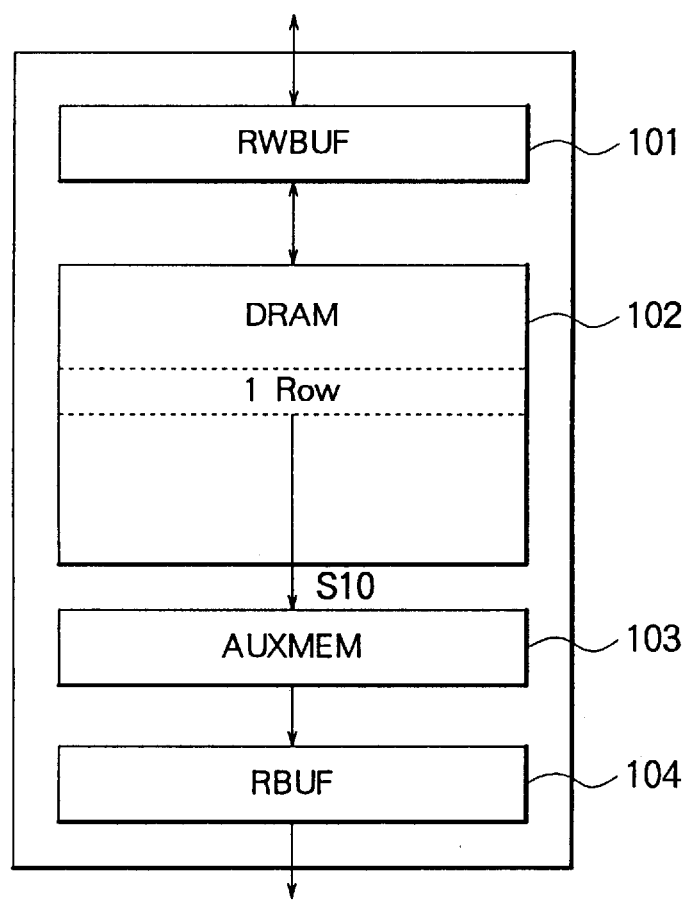
FIG. 1 is a block diagram of the configuration of a semiconductor memory device of the related art.
Figure 2:
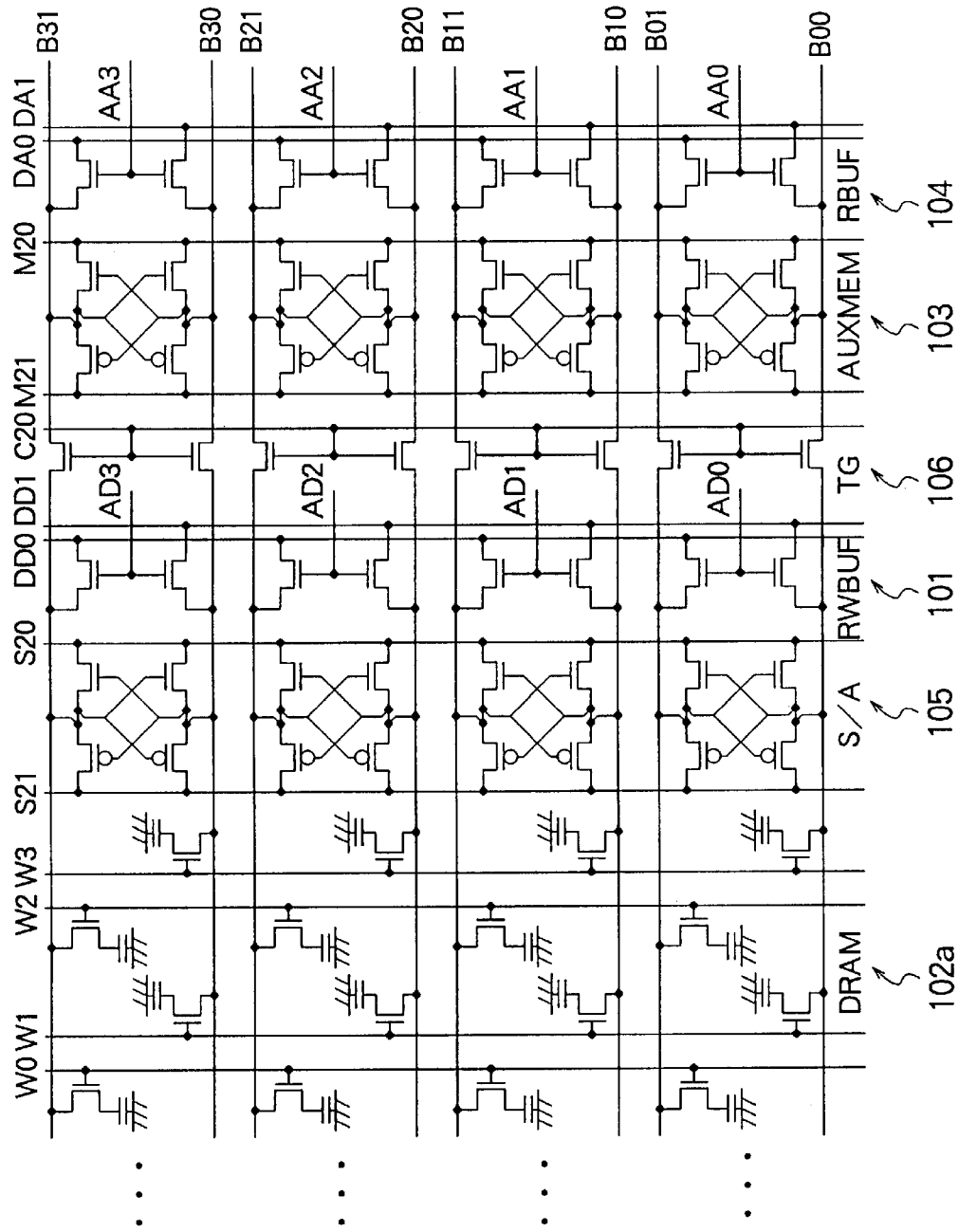
FIG. 2 is a circuit diagram of an example of the memory device shown in FIG. 1.
Figure 3:
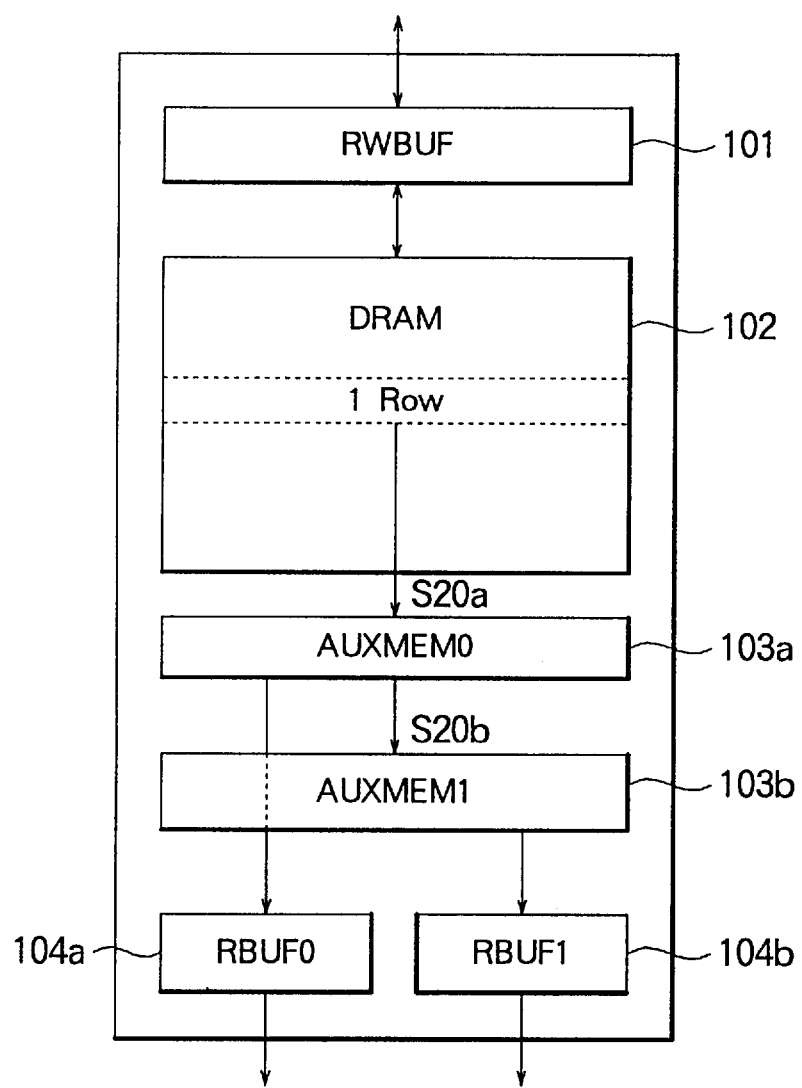
FIG. 3 is a view of the configuration of a semiconductor memory device according to a first embodiment of the present invention.

FIG. 3 is a view of the configuration of a semiconductor memory device according to a first embodiment of the present invention. In FIG. 3, reference number 101 denotes a reading/writing buffer (RWBUF). Reference numeral 102 denotes a memory cell array constituted by a DRAM. Reference numerals 103*a* and 103*b* denote auxiliary memories (AUXMEM0, AUXMEM1) and 104*a* and 104*b* denote reading buffers (RBUF0, RBUF1), respectively. The memory cell array 102 stores data input from external circuits through the reading/writing buffer 101 and outputs the stored data to the external circuits through the reading/writing buffer 101. Further, the data stored in the memory cell array 102 is transmitted to the auxiliary memory 103*a* through sensing amplifiers (not shown).

The auxiliary memory 103*a* stores the data transferred from the sensing amplifiers once and outputs the stored data through the reading buffer 104*a* and, further, transfers the stored data to the auxiliary memory 103*b*. The auxiliary memory 103*b* stores the data transferred from the auxiliary memory 103*a* once and outputs the stored data to the external circuits through the reading buffer 104*b*. In the memory device described above, data is written to the memory cell 102 and read from the memory cell 102 through the reading/writing buffer 101. Then the data stored in the memory cell array 102 is transmitted to the auxiliary memory 103*a* in response to a data transfer control signal S20*a* through the sensing amplifiers and data transfer gates, not shown, and is stored once in the auxiliary memory 103*a*. The data stored in the auxiliary memory 103*a* is output to outside through the reading buffer 104*a* and further transferred to the auxiliary memory 103*b* in response to a data transfer control signal S20*b* through a not shown transfer gate and stored once by the auxiliary memory 103*b*. The data stored in the auxiliary memory 103*b* is output to the external circuits through the reading buffer 104*b*.

In this way, two auxiliary memories 103*a* and 103*b* are arranged. Part of the data stored in the memory cell array 102 is transferred to these auxiliary memories 103*a* and 103*b* in that order and temporarily stored by these auxiliary memories. The data stored in these auxiliary memories is output to the external circuits independently by the reading buffers 104*a* and 104*b* to improve the data output speed. Further, after the data stored in the memory cell array 102 is transmitted to the auxiliary memories, the memory cell array 102 and the auxiliary memories 103*a* and 103*b* can operate independently, so the efficiency of use of the memories can be improved.

Figure 4:
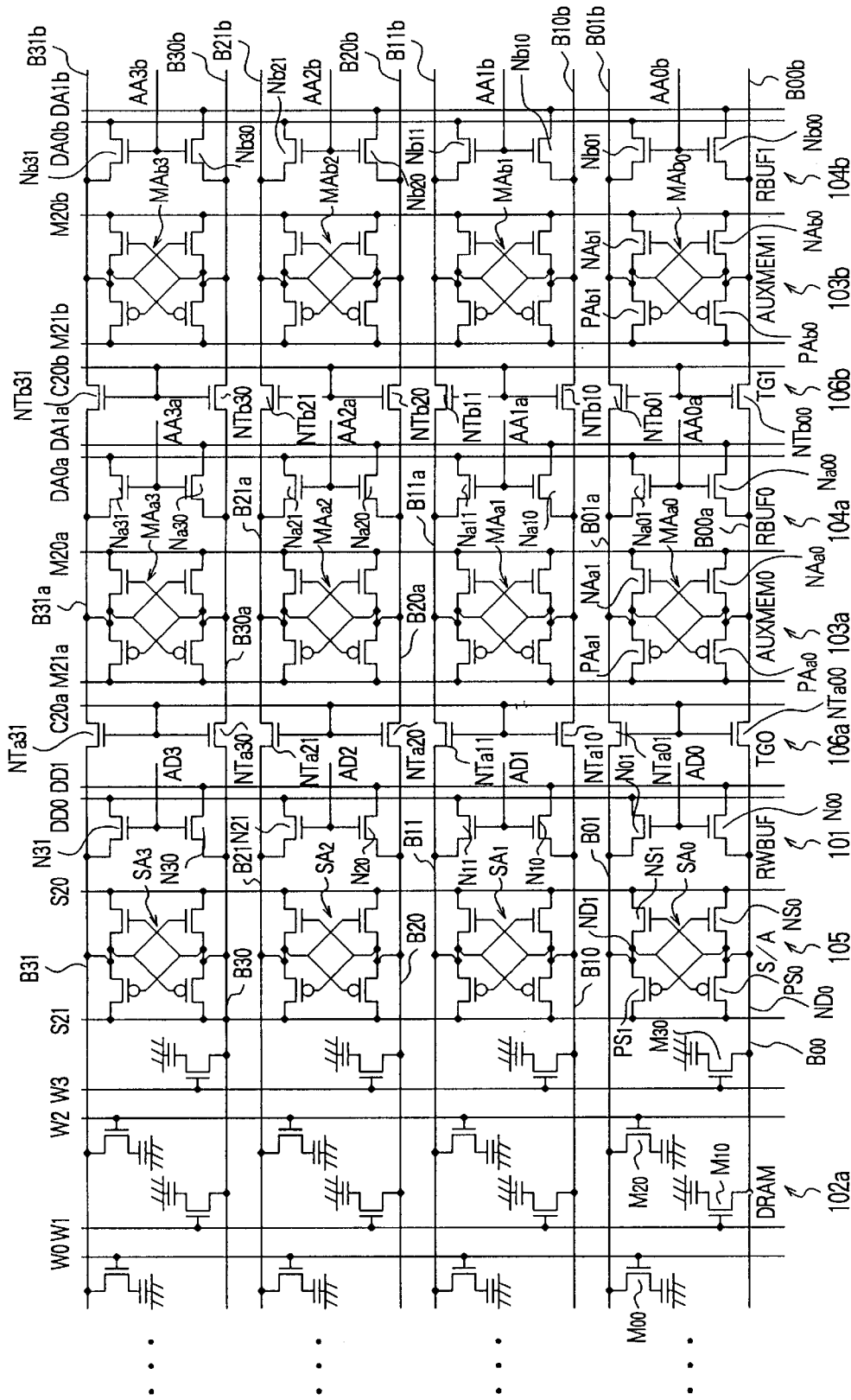
FIG. 4 is a circuit diagram of an example of the memory device shown in FIG. 3.
Figure 5:
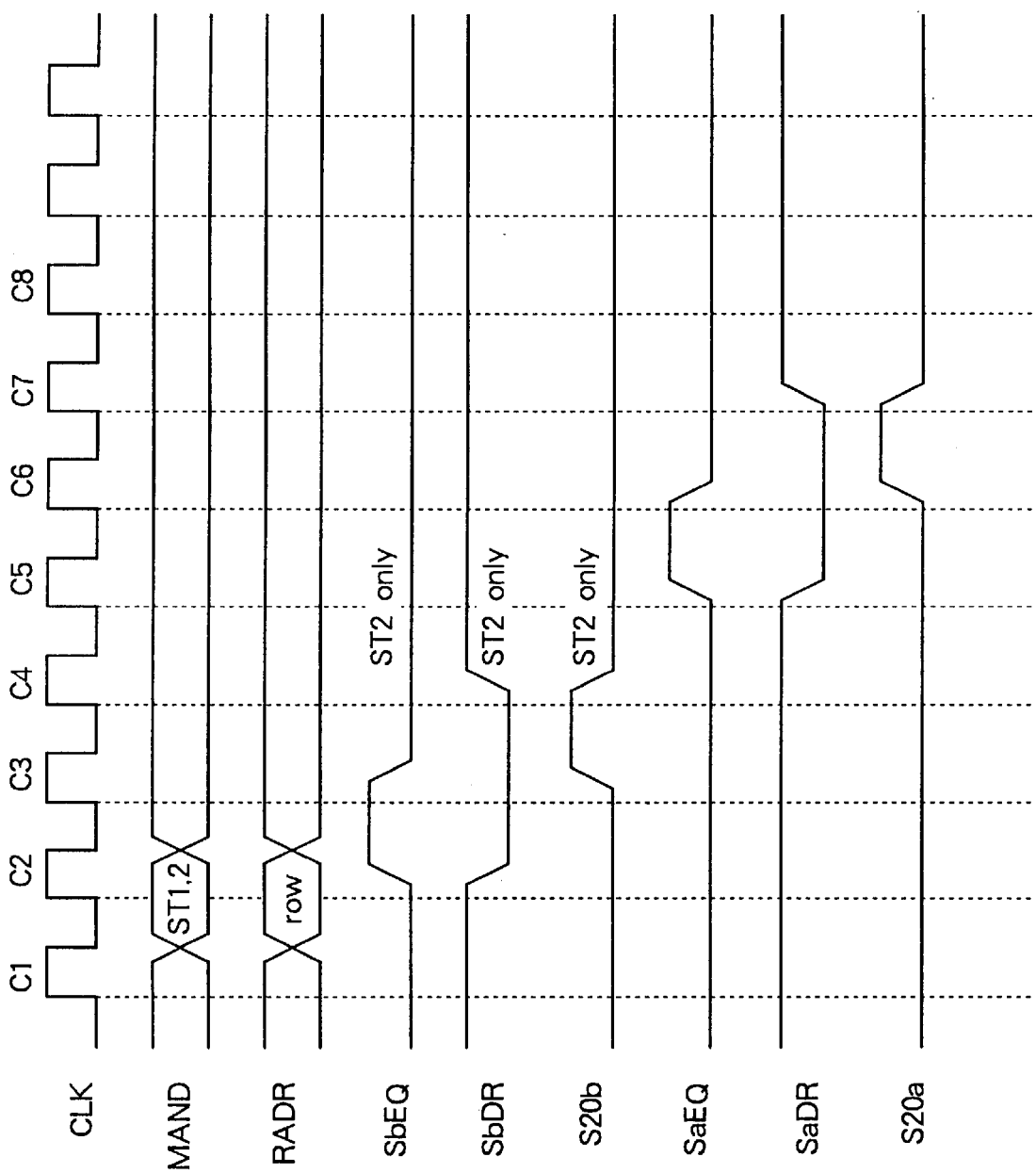
FIGS. 5A to 5I are timing charts of the data transfer of the memory device shown in FIG. 4.

FIG. 4 is a circuit diagram of the example of the configuration of a part of the memory cell array 102*a* and the auxiliary memories 103*a* and 103*b*. In FIG. 4, reference number 101 denotes a reading/writing buffer, 102*a* denotes a part of the memory cell array 102, 103*a* and 103*b* denote auxiliary memories, 104*a* and 104*b* denote reading buffers, 105 denotes sensing amplifier circuit (S/A), and 106*a* and 106*b* denote transfer gates (TG0, TG1), respectively. Further, W0, W1, W2, and W3 denote word lines, B00, B01, B10, B11, B20, B21, B30, B31, B00*a*, B01*a*, B10*a*, B11*a*, B20$a$, B21$a$, B30$a$, B31$a$, B00$b$, B01$b$, B10$b$, B11$b$, B20$b$, B21$b$, B30$b$, and B31$b$ denote bit lines, S20 and S21 denote driving signal lines of the sensing amplifier circuit 105, M20$a$ and M21$a$ denote driving signal lines of the auxiliary memory 103$a$, M20$b$ and M21$b$ denote driving signal lines of the auxiliary memory 103$a$, M20$b$ and M21$b$ denote driving signal lines of the auxiliary memory 103$b$, DD0 and DD1 denote input/output data lines of the reading/writing buffer 101, C20$a$ denotes a control signal line of the transmission gate 106$a$, C20$b$ denotes a control signal line of the transfer gate 106$b$, DA0$a$ and DA1$a$ denote data output lines of the auxiliary memory 103$a$, DA0$b$ and DA1$b$ denote data output lines of the auxiliary memory 103$b$, AD0, AD1, AD2, and AD3 denote data input/output lines of the memory cell array 102, AA0$a$, AA1$a$, AA2$a$, and AA3$a$ denote data output control signal lines of the auxiliary memory 103$a$, and AA0$b$, AA1$b$, AA2$b$, and AA3$b$ denote data output control single lines of the auxiliary memory, respectively.

As shown in FIG. 4, the DRAM memory cell array 102$a$ forming the main memory device consists of an arrangement of folded pair lines. In the memory cell array 102$a$, the word lines W0, W1, W2, and W3 and the bit lines B00, B01, B10, B11, B20, B21, B30, and B31 are arranged to cross each other, and memory cells are arranged at the crossing points. For example, the memory cell $M_{00}$ is laid at the crossing of the word line W0 and the line B01, the memory cell $M_{10}$ is laid at the crossing of the word line W1 and the bit line B00, the memory cell $M_{20}$ is laid at the crossing of the word line W2 and the bit line B01, and the memory cell $M_{30}$ is laid at the crossing of the word line W3 and the bit line B00. Here, the memory cells $M_{00}$, $M_{10}$, $M_{20}$, and $M_{30}$ are constituted by NMOS transistors as switching elements and capacitors, respectively. Similarly, other memory cells are laid at the crossings of the word lines W0, W1, W2, and W3 and the bit lines B10, B11, B20, B21, B30, and B31, respectively.

The bit lines B00, B01, B10, B11, B20, B21, B30, and B31 are connected to sensing amplifiers $SA_0$, $SA_1$, $SA_2$, and $SA_3$ forming the sensing amplifier circuit 105. The data stored in the memory cell array 102$a$ is latched by these sensing amplifiers and is output after being amplified. The sensing amplifiers $SA_0$, $SA_1$, $SA_2$, and $SA_3$ forming the sensing amplifier circuit 105 are constituted by flip-flops. As illustrated in FIG. 4, the sensing amplifier $SA_0$ is constituted by an inverter formed by a PMOS transistor $PS_0$ and an NMOS transistor $NS_0$ and an inverter formed by a PMOS transistor $PS_1$ and an NMOS transistor $NS_1$. The source of the PMOS transistor $PS_0$ is connected to the driving signal line S21 and the drain is connected to a node $ND_0$, while the source of the NMOS transistor $NS_0$ is connected to the driving signal line S20, the drain is connected to the node $ND_0$. The node $ND_0$ constitutes an output terminal of an inverter formed by these transistors.

The source of the PMOS transistor $PS_1$ is connected to the driving signal line S21 and the drain is connected to a node $ND_1$, while the source of the NMOS transistor $NS_1$ is connected to the driving signal line S20 and the drain is connected the node $ND_1$. The node $ND_1$ constitutes an output terminal of the inverter formed by these transistors. The gates of the PMOS transistor $PS_0$ and the NMOS transistor $NS_0$ are connected to the node $ND_1$ commonly and the gates of the PMOS transistor $PS_1$ and the NMOS transistor $NS_1$ are connected to the node $ND_0$ commonly. The node $ND_0$ is connected to the bit line B00 and the node $ND_1$ is connected to the bit line B01.

During the operation of the sensing amplifier $SA_0$, the driving signal line S21 is held at a level of, for example, the power supply voltage Vcc and the driving signal line S20 is held at a level of, for example, the ground GND. The same is true for the other sensing amplifiers $SA_1$, $SA_2$, and $SA_3$ constituting the sensing amplifier circuit 105. The reading/writing buffer 101 is connected to the bit line B00, B01, B10, B11, B20, B21, B30, and B31. The reading/writing buffer 101 is constituted by, for example, NMOS transistors having one diffusion region connected to the bit lines and the other diffusion region connected to the data input/output lines DD0 and DD1 and gates connected to the data input/output control signal line AD0, AD1, AD2, and AD3, respectively. The reading/writing buffers connected to the bit lines B00 and B01 are constituted by NMOS transistors $N_{00}$ and $N_{01}$. One diffusion region of the NMOS transistor $N_{00}$ is connected to the bit line B00 and the other diffusion region is connected to the data input/output line DD1, while one diffusion region of the NMOS transistor $N_{01}$ is connected to the bit line B01 and the other diffusion region is connected to the data input/output line DD0. The gates of the NMOS transistors $N_{00}$ and $N_{01}$ are connected to the data input/output control signal line AD0 commonly. During reading or writing operations, by successively setting the data input/output control signal lines AD0, AD1, AD2, and AD3 at an active state, for example, at the level of the power supply voltage Vcc, the buffers are held at the on state and the data input to the input/output lines DD0 and DD1 is successively written to the selected memory cells or the data stored in the selected memory cells is successively read out to the input/output lines DD0 and DD1. The bit lines B00, B01, B10, B11, B20, B21, B30, and B31 are connected to the bit lines B00$a$, B01$a$, B10$a$, B11$a$, B20$a$, B21$a$, B30$a$, and B31$a$ respectively through the transfer gate 106$a$, while the bit lines B00$a$, B01$a$, B10$a$, B11$a$, B20$a$, B21$a$, B30$a$, and B31$a$ are connected to the bit lines B00$b$, B01$b$, B10$b$, B11$b$, B20$b$, B21$b$, B30$b$, and B31$b$ respectively through the transfer gate 106$b$.

For example, an NMOS transistor NTa00 is connected between the bit line B00 and the bit line B00$a$, and an NMOS transistor NTa01 is connected between the bit line B00 and the bit line B01$a$. The gates of the NMOS transistors NTa00 and NTa01 are connected to the control signal lines C20 of the transfer gate 106$a$. The auxiliary memory cells MAa0, MAa1, MAa2, and MAa3 forming the auxiliary memory 103$a$ are connected to the bit lines B00$a$, B01$a$, B10$a$, B11$a$, B20$a$, B21$a$, B30$a$, and B31$a$, respectively, while the auxiliary memory cells MAb0, MAb1, MAb2, and MAb3 forming the auxiliary memory 103$b$ are connected to the bit lines B00$b$, B01$b$, B10$b$, B11$b$, B20$b$, B21$b$, B30$b$, and B31$b$, respectively.

For example, the auxiliary memory cell MAa0 connected to the bit lines B00$a$ and B01$a$ is a flip-flop constituted by transistors PAa0, NAa0, PAa1, and NAa1. The other auxiliary memory cells MAa1, MAa2, and MAa3 have similar configurations as that of the auxiliary memory cell MAa0. The auxiliary memory cell MAb0 connected-to the bit lines B00$b$ and B01$b$ is a flip-flop constituted by transistors PAb0, NAb0, PAb1, and NAb1. The other auxiliary memory cells MAb1, MAb2, and MAb3 have similar configurations as that of the auxiliary memory cell MAb0.

The bit lines B00$a$, B01$a$, B10$a$, B11$a$, B20$a$, B211$a$, B30$a$, and B31$a$ are connected to the data output lines DA0$a$ and DA1$a$, respectively, through the reading buffer 104$a$. The reading buffer 104$a$ is constituted by NMOS transistors having one diffusion region connected to the bit lines and the other diffusion region connected to the data output lines DA0$a$ and DA1$a$ and gates connected to the data output control signal lines AA0$a$, AA1$a$, AA2$a$, and AA3$a$, respectively. The buffer connected to the bit lines B00$a$ and B01$a$ is constituted by the NMOS transistors $Na_{00}$ and $Na_{01}$. One diffusion region of the NMOS transistor $Na_{00}$ is connected to the bit line B00a, and the other diffusion region is connected to the data input/output line DA1a. One diffusion region of the NMOS transistor $Na_{01}$ is connected to the bit line B01a, and the other diffusion region is connected to the data output line DA0a. The gates of the NMOS transistors $Na_{00}$ and $Na_{01}$ are connected to the data output control signal line AA0a commonly. The other buffers constituting the reading buffer 104a have similar configurations.

During reading operations, by successively setting the data output control signal line AA0a, AA1a, AA2a, and AA3a to an active state, for example, at the level of the power supply voltage Vcc, the buffers are successively set in an on state and the data stored in the auxiliary memory cells MAa0, MAa1, MAa2, and MAa3 is successively output to the data output lines DA0a and DA1a.

The bit lines B00b, B01b, B10b, B11b, B20b, B21b, B30b, and B31b are connected to the data output lines DA0b and DA1b, respectively, through the reading buffer 104b. The reading buffer 104b is constituted by NMOS transistors having one diffusion region connected to the bit lines and the other diffusion region connected to the data output lines DA0b and DA1b and gates connected to the data output control signal lines AA0b, AA1b, AA2b, and AA3b, respectively.

The buffer connected to the bit lines B00b and B01b is constituted by NMOS transistors $Nb_{00}$ and $Nb_{01}$. One diffusion region of the NMOS transistor $Nb_{00}$ is connected to the bit line B00b and the other diffusion region is connected to the data output line DA1b, while one diffusion region of the NMOS transistor $Nb_{01}$ is connected to the bit line B01b and the other diffusion region is connected to the data output line DA0b. The gates of the NMOS transistors $Nb_{00}$ and $Nb_{01}$ are connected to the data output control signal line AA0b commonly. The other buffers constituting the reading buffer 104b have similar configurations. During a reading operation, by successively setting the data output control signal lines AA0b, AA1b, AA2b, and AA3b to an active state, for example, at the level of the power supply voltage Vcc, the buffers are successively set in the on state and the data stored in the auxiliary memory cells MAb0, MAb1, MAb2, and MAb3 is successively output to the data output lines DA0b and DA1b. Next, an explanation will be given of the operation of the memory device having the configuration described above.

During a memory access, by selecting a certain word line, all the memory cells connected to the word line are selected. The data is input to or output from the selected memory cells through the reading/writing buffer 101. The data stored in the memory cell array 102 is successively transmitted to the auxiliary memory 103a and 103b through the transfer gates 106a and 106b, stored by these auxiliary memories once, and further output to an external circuit in response to a reading control signal.

More specifically, among the data stored in the memory cell array 102a, one line's worth of data selected by the input address is transferred to the auxiliary memory 103. During the data transfer, the transfer gate 106a for example is closed. A certain word line is selected and rises up. In response to this, one line's worth of data of the selected memory cell line is output to the bit lines B00, B01, B10, B11, B20, B21, B30, and B31 and is latched by the sensing amplifier circuit 105. Next, an active control signal, for example, the transfer control signal of the level of the power supply voltage Vcc is input to the data transfer control signal line C20a, the transistor constituting the transfer gate 106a is held in an on state, and the data output to the bit lines B00, B01, B10, B11, B20, B21, B30, and B31 is transferred to the bit lines B00a, B01a, B10a, B11a, B20a, B21a, B30a, and B31a and held once by the auxiliary memory 103a. The data stored in the auxiliary memory 103a is transferred to the auxiliary memory 103b through the transfer gate 106b and is held by the auxiliary memory 103b. For example, when a transfer control signal S20a of a low level is input to the data transfer control signal line C20a, the transfer gate 106a is held in the closed state, a transfer control signal S20b of the level of the power supply voltage Vcc is input to the data transfer control signal line C20b, and the transfer gate 106b is held in the open state, the data output to the bit lines B00a, B01a, B10a, B11a, B20a, B21a, B30a, and B31a, that is, the data once held by the auxiliary memory 103a, is transferred to the bit lines B00b, B01b, B10b, B11b, B20b, B21b, B30b, and B31b and is held once by the auxiliary memory 103b. The held data is output to the data output lines DA0b and DA1b through the reading buffer 104b.

FIGS. 5A to 5I are timing charts showing the data transfer of the memory device in this embodiment. Next, an explanation of the memory device will be made with reference to FIG. 4 and FIGS. 5A to 5I. In the timing charts of FIGS. 5A to 5I, the operations when the command ST1 and command ST2 are executed are illustrated. Here, the command ST1 is, for example, a command for transferring one line's worth of data from the memory cell array 102 serving as the main memory to the auxiliary memory 103a, and the command ST2 is a command for transferring one line's worth of data from the memory cell array 102 to the auxiliary memory 103a after the data transfer from the auxiliary memory 103a to 103b. As illustrated, during the period C1 of the clock signal CLK, the memory device receives the command ST1 and operates accordingly. At the same time, a row address for assigning the row of the memory cell array 102 is input and a high level reading voltage is input to a word line according to the designated row. Here, for example, a data transfer operation when the command ST2 is executed will be explained. First, at the timing of the C2 period, a control signal SbEQ for equalizing the auxiliary memory 103b rises. In response to this, the memory cells MAb0–MAb3 forming the auxiliary memory 103b are equalized. At the same time as the control signal SbEQ, a control signal SbDR for driving the auxiliary memory 103b falls. In response to this, the driving signal lines M20b and M21b of the auxiliary memory 103b are held at the ground level GND and the power supply voltage Vcc level, respectively. Then, at the timing of the period C3 of the clock signal CLK, the control signal S20b is input to the control signal time C20b. In response to this, the transfer gate 106b is held at the on state, and the data stored once in the auxiliary memory 103a is transferred to the auxiliary memory 103b. Next, at the timing of C5, a control signal SaEQ for equalizing the auxiliary memory 103 rises. In response to this, the memory cells MAa1–MAa3 forming the auxiliary memory 103a are equalized. At the same time as the control signal SaEQ, a control signal SaDR for driving the auxiliary memory 103a falls. In response to this, the driving signal lines M20a and M21a of the auxiliary memory 103a are held at the ground level GND and the power supply voltage Vcc level, respectively. Then, at the timing of the period C6 of the clock signal CLK, the control S20a is input to the control signal line C20a. In response to this, the transfer gate 106a is held in the on state, the data of a row in the memory cell array 102 designated by the row address RADR is transferred to the auxiliary memory 103a. The operation timings when the command ST2 is executed were described above. In case when the command ST1 is executed, the control signal associated with the auxiliary memory 103b is not executed, that is, there is no data transfer from the auxiliary memory 103a to 103b. In the memory cell array 102 serving as the main memory, the data of a row designated by the row address RADR is transferred to the auxiliary memory 103a only.

As explained above, according to this embodiment, the access to the memory cell array 102 is performed through the reading/writing buffer 101. The data input from the outside is stored in the memory cell array 102 and the stored data is transferred through the transfer gate to the auxiliary memory 103a in response to the transfer control signal S20a and further transferred to the auxiliary memory 103b through the transfer gate in response to the transfer control signal S20b and stored once by these auxiliary memories. Since the data stored in the auxiliary memory 103a is output through the reading buffer 104a and the data stored in the auxiliary memory 103b is output through the reading buffer 104b independently, the rate and the efficiencies of the data transfer can be improved and an increase of the chip dimensions can be minimized.

Second Embodiment

Figure 6:
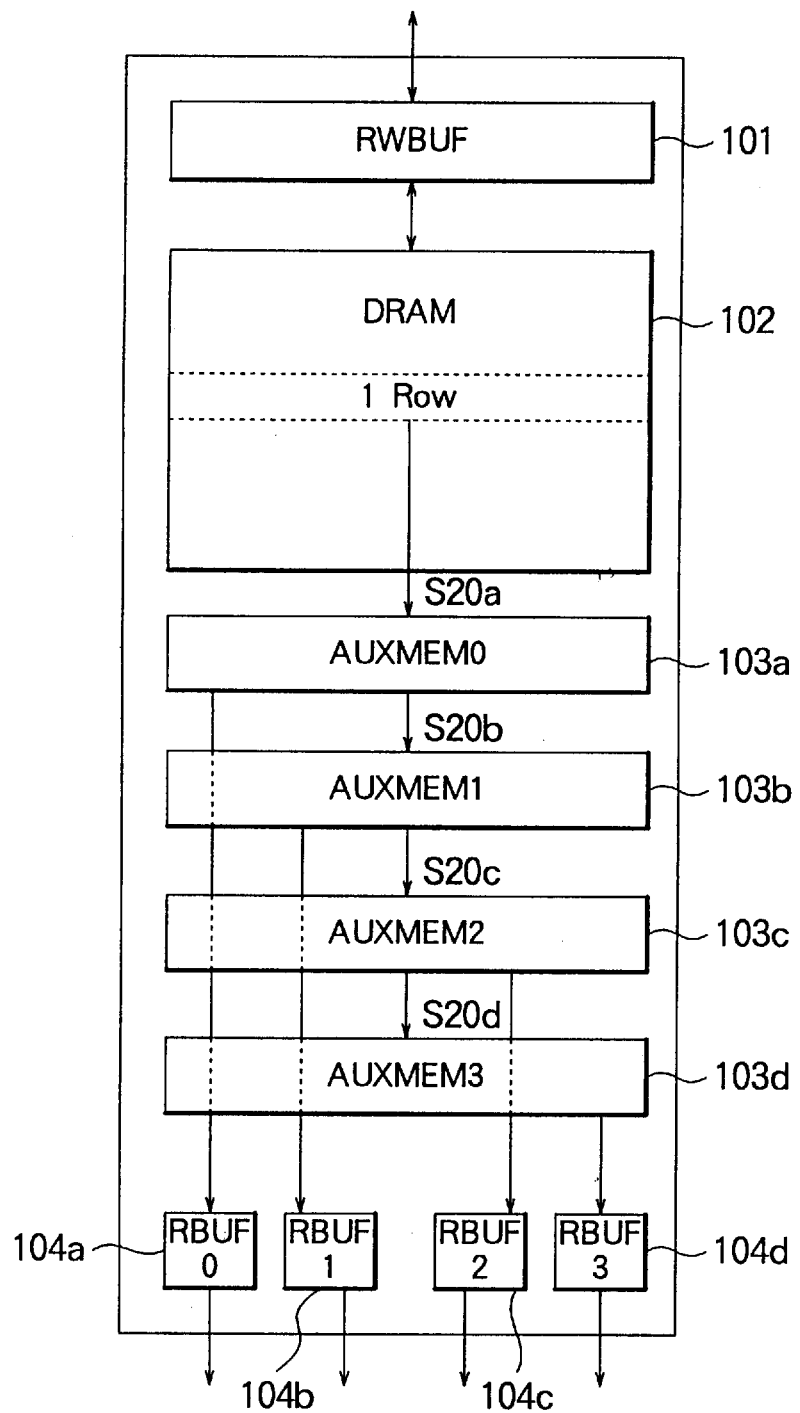
FIG. 6 is a view of the configuration of a semiconductor memory device according to a second embodiment of the present invention.

FIG. 6 shows the configuration of a memory device according to a second embodiment of the present invention. As shown in FIG. 6, in this embodiment of the memory device, the auxiliary memory 103c and 103d and reading buffers 104c and 104d are added to the first embodiment shown in FIG. 3.

Next, the difference between this embodiment and the first embodiment will be explained. Data stored in the memory cell array 102 is transferred to the auxiliary memory 103a through a transfer gate, not shown, in response to a transfer control signal S20a and is held once by the auxiliary memory 103a. The data held is transferred to the auxiliary memory 103b through a transfer gate, not shown, in response to a transfer control signal S20b and is held once in the auxiliary memory 103b.

Further, the data held in the auxiliary memory 103b is transferred to the auxiliary memory 103c through a transfer gate, not shown, in response to a transfer control signal S20c and held once by the auxiliary memory 103c. The data held in the auxiliary memory 103c is transferred to the auxiliary memory 103d through a transfer gate, not shown, in response to a transfer control signal S20d and held once by the auxiliary memory 103d.

As mentioned above, the data stored in the memory cell array 102 is successively transferred to the auxiliary memories 103a, 103b, 103c, and 103d in response to the transfer control signals S20a, S20b, S20c, and S20d, respectively, and held once by these auxiliary memories. Then the data held in the auxiliary memories 103a, 103b, 103c, and 103d is output to the external circuits through the reading buffers 104a, 104b, 104c, and 104d independently. In accordance with this, the data transfer rate can be improved and the data transfer efficiency can be maximized more than the first embodiment while restricting the increase of the dimensions of the memory chip. When desiring to change the data of a part of the auxiliary memories, for example, the data in the auxiliary memory 103b, first, the writing data is transferred from the memory cell array 102 to the auxiliary memory 103a, then transferred from the auxiliary memory 103a to 103b. After this, by transferring the original data again to the auxiliary memory 103a, the data of a part of the auxiliary memories, here for example the data in the auxiliary memory 103b, can be changed by two accesses to the memory cell array 102, here, two data reading operations.

As explained above, according to this embodiment, the data stored in the memory cell array 102 is successively transferred to the auxiliary memories 103a, 103b, 103c, and 103d in response to the transfer control signals S20a, S20b, S20c, and S20d, respectively, and held once by these auxiliary memories. Since the data held in these auxiliary memories is output to the external circuits through the reading buffers 104a, 104b, 104c, and 104d independently, high speed and high efficiency data transfer can be realized and the performance of the memory devices can be improved while an increase of the dimensions of memory chips can be restricted to a minimum.

Third Embodiment

Figure 7:
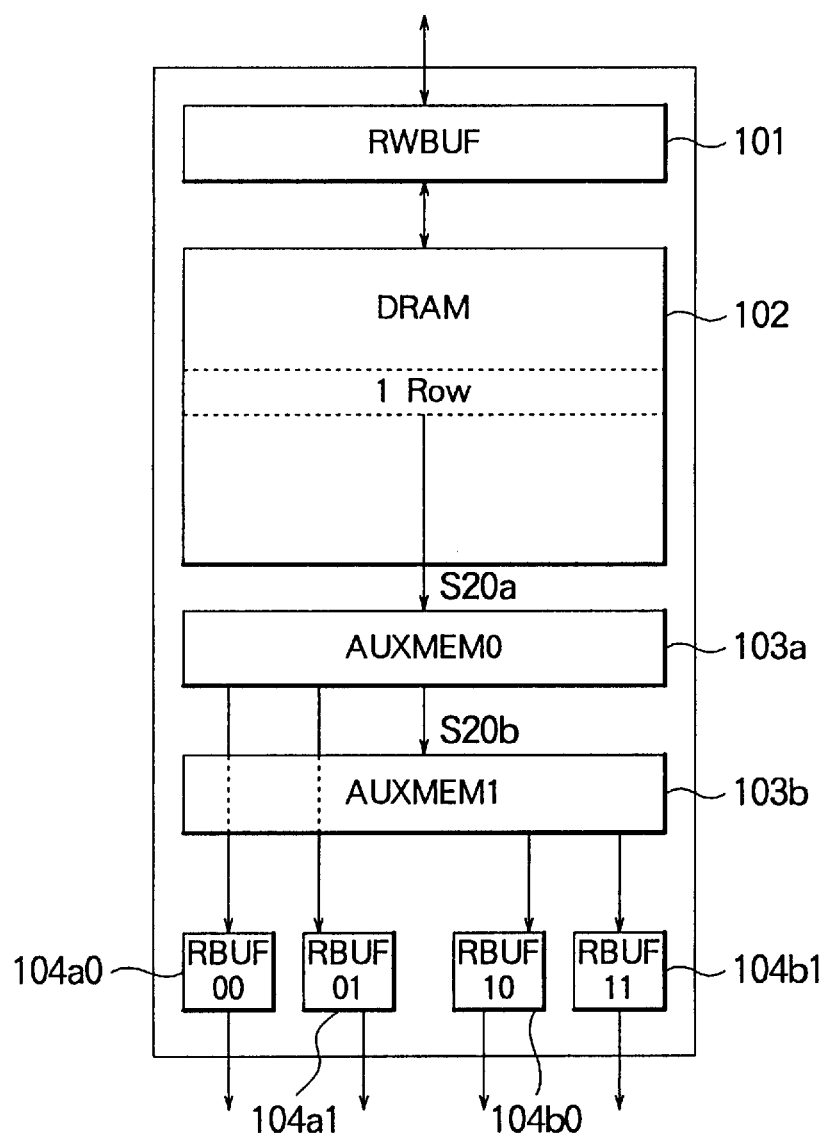
FIG. 7 is a view of the configuration of a semiconductor memory device according to a third embodiment of the present invention.

FIG. 7 shows the configuration of the memory device according to a third embodiment of the present invention. As shown in FIG. 7, in this embodiment of the memory device, two reading buffers 104a0 and 104a1 are connected to the auxiliary memory 103a and two reading buffers 104b0 and 104b1 are connected to the auxiliary memory 103b, respectively.

Next, the difference between this embodiment and the first embodiment will be explained. Data stored in the memory cell array 102 is transferred to the auxiliary memory 103a through a transfer gate, not shown, in response to a transfer control signal S20a and held once by the auxiliary memory 103a. Further, the data held in the auxiliary memory 103a is transferred to the auxiliary memory 103b through a transfer gate, not shown, in response to a transfer control signal S20b and held once by the auxiliary memory 103b.

The data held in the auxiliary memory 103a is output to the external circuits through two reading buffers 104a0 and 104a1 in parallel. Similarly, the data held in the auxiliary memory 103b is output to the external circuits through the reading buffers 104b0 and 104b1 in parallel. According to this, since the data held in the auxiliary memories 103a and 103b can be output to the outside through the reading buffers in parallel, that the data output rate can be improved. For example, in a three-dimensional computer graphic system, a plurality of series of texture data can be read out at the same time and texture data can be stored in empty areas thereby forming a highly flexible configuration and enabling high speed texture mapping at a relatively low cost.

As mentioned above, according to this embodiment, the data stored in the memory cell array 102 is successively transferred to the auxiliary memory 103a and 103b in response to the transfer control signals S20a and S20b and held once by these auxiliary memories. Since the data held in the auxiliary memories 103a can be output through the reading buffers 104a0 and 104a1 in parallel and, similarly, the data held in the auxiliary memory 103b can be output through the reading buffers 104b0 and 104b1 in parallel, the reading speed and the flexibility of data storage can be improved and high speed data access can be realized at low cost.

What is claimed is:

1. A semiconductor memory device comprising:
   a memory cell array including a plurality of memory cells being able to be written with and read out data arranged in a matrix;
   a reading/writing means for reading and writing data with respect to a selected memory cell;
   a plurality of auxiliary data storing means arranged in series, a first means of said plurality of auxiliary data storing means being connected to the memory cell array, and each of the auxiliary data storing means storing a part of the data stored in the memory cell array;

a plurality of data output means, each of the data output means being connected to one of the auxiliary data storing means; and a plurality of external data buses, each of the external data buses being connected to one of the data output means; wherein each of the data output means is able to independently output the data stored in a corresponding auxiliary data storing means to a corresponding external data bus.

2. A semiconductor memory device as set forth in claim 1, wherein each of said auxiliary data storing means except for a last means is able to transfer the stored data to a next auxiliary data storing means.

3. A semiconductor memory device as set forth in claim 1, wherein said plurality of auxiliary data storing means store texture mapping data for a computer graphic.

4. A semiconductor memory device as set forth in claim 1, wherein each of said data output means has at least two sub output buffers able to output data in parallel.

5. A semiconductor memory device comprising:

a memory cell array including a plurality of memory cells being able to be written with and read out data arranged in a matrix of a plurality of word lines and a plurality of bit lines;

a reading/writing means for reading and writing the data of a selected memory cell addressed by a selected word line and a selected bit line;

a plurality of auxiliary data latches arranged in series, a first auxiliary data latch of said plurality of auxiliary data latches being connected to the memory cell array, and each of the auxiliary data latches storing data of a selected word line sector of the memory cell array;

a plurality of data output means, each of the data output means being connected to a corresponding auxiliary data latch; and a plurality of external data buses, each of the external data buses being connected to a corresponding data output means; wherein each of the data output means is able to output the data stored in a corresponding auxiliary data latch to a corresponding external data bus independently.

6. A semiconductor memory device as set forth in claim 5, wherein each of said auxiliary data latches except for a last latch is able to transfer the stored data to a next auxiliary data latch.

7. A semiconductor memory device as set forth in claim 6, wherein said transfer of the stored data to a next latch is carried out through a corresponding transferring means, each said transferring means being formed by a plurality of transfer gates, each of said transfer gates including at least one transistor corresponding to the memory cell in the word line sector and set to an ON state in response to an application of a control signal.

8. A semiconductor memory device as set forth in claim 7, wherein said memory cell array has a folded bit line circuit and each of said transfer gates includes a pair of transistors corresponding to each adjacent bit line pair.

9. A semiconductor memory device as set forth in claim 5, wherein said plurality of auxiliary data latches store texture mapping data for a computer graphic.

10. A semiconductor memory device as set forth in claim 5, wherein each of said data output means has at least two sub output buffers able to output data in parallel.

* * * * *